METHOD OF APPLYING A NIOBIUM LAYER TO A COPPER CARRIER BY ELECTROLYTIC DEPOSITION FROM FUSED SALTS

Filed March 27, 1970

United States Patent Office 3,691,031
Patented Sept. 12, 1972

3,691,031
METHOD OF APPLYING A NIOBIUM LAYER TO A COPPER CARRIER BY ELECTROLYTIC DEPOSITION FROM FUSED SALTS

Walter Lugscheider, Erlangen, Germany, assignor to Siemens Aktiengesellschaft, Berlin and Munich, Germany Filed Mar. 27, 1970, Ser. No. 23,358
Claims priority, application Germany, Mar. 29, 1969, P 19 16 293.7
Int. Cl. C23b 5/00
U.S. Cl. 204—39 15 Claims

ABSTRACT OF THE DISCLOSURE

A niobium layer is produced on a copper carrier by electrolytically depositing niobium from a melt upon the copper surface. The surface has an average dimension across the grain of at least 1 mm. and the carrier is substantially free of elastic tension and substantially free of lattice defects.

Figures 1, 2:
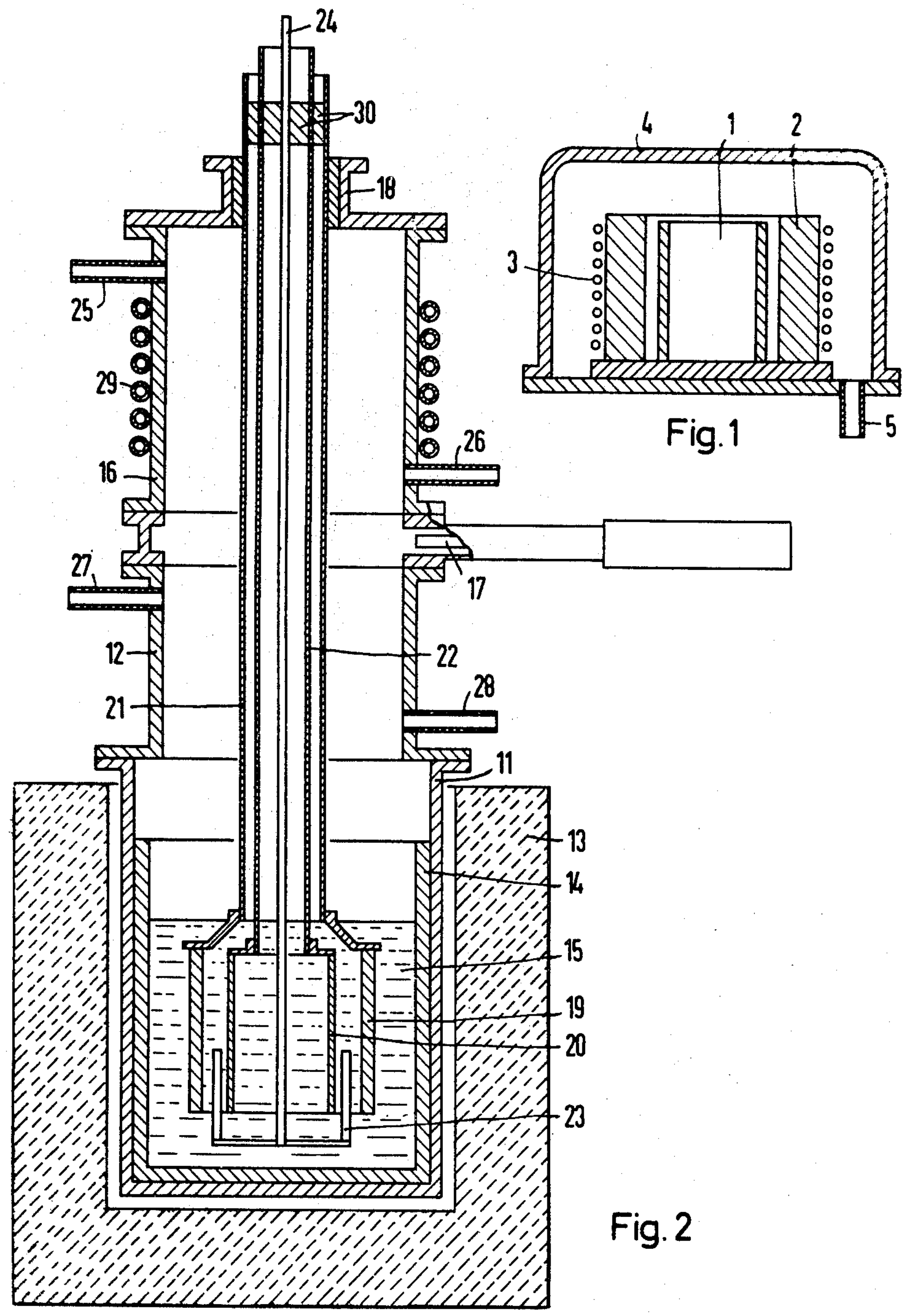

My invention relates to a method of applying a niobium layer on a copper carrier by deposition from a fused electrolytic bath.

For various components in which the superconductivity of a surface layer should be used, it is desirable to have the carrying structure for a superconducting layer made of a metal which has good mechanical workability, is heat conductive and not superconductive. This applies especially to superconducting resonators for particle accelerators, for which it has already been tried to construct the reasonating cavities with copper and thereupon to form a layer of niobium. In this connection, reference may be had to the article by C. Passow, Elektrotechnische Zeitschrift, Ausgabe A, volume 89 (1968), pages 341 to 346. Methods of applying niobium on copper by electrolytic deposition in which the electrolytes consist of melts of niobium fluorides and alkali fluorides are known. See the article by G. W. Mellors and S. Senderoff, Journal of the Electrochemical Society, volume 112 (1968), pages 266 to 272. With these methods, in which niobium layers are applied to conventional copper carriers, there is the disadvantage that even with the highest possible purity of the electrolyte and of the protective gas used in the deposition apparatus such a great portion of gaseous impurities, especially oxygen, is included in the niobium layers, that the superconductive characteristics of these niobium layers are substantially poorer than those of pure niobium. Cleaning this niobium layer by degasification would require a temperature of over 2000° C. and is not realizable because of the copper carrier. Although the niobium layer could be removed from the copper carrier and only then be annealed, this is achieveable only at considerable expense. In addition, there is the difficulty that the niobium layer being unsupported after its separation from the copper carrier becomes deformed at the required high annealing temperatures and annealing times; this condition is not permissible because of the small tolerances of the resonator cavity dimensions.

Accordingly, it is an object of my invention to provide a method of applying a niobium layer to a copper carrier by fusion electrolytic deposition. Subsidiary to this object, it is an object of my invention to provide an improved method of applying niobium to a copper carrier wherein the niobium layers are thick, crystalline, metallically coherent and of pure niobium. It is still another object of my invention to provide a method of applying a niobium layer to a copper carrier wherein the already mentioned difficulties are minimized or eliminated.

According to a feature of the invention, the niobium is deposited on a tension-free copper carrier substantially free of lattice defects, the carrier having grains of an average dimension across the surface of at least 1 mm. at the face thereof upon which the niobium is deposited.

By average dimension "across the surface" of the grains is meant the average of the crosswise dimensions of the surfaces of the respective grains that lie parallel to the face of the carrier upon which the niobium is deposited. The grains can have a smaller dimension in a direction perpendicular to the face upon which the niobium is deposited. The average crosswise grain surface dimension is determined from counting the number of grains in a unit of carrier surface area.

The invention confirms the finding that niobium layers deposited by electrolytic deposition from a fused bath on a copper carrier substantially free of lattice defects grow epitaxially, so that the grown niobium layer exhibits the same grain structure as the copper carrier at the surface of the latter upon which the niobium deposition is made. Epitaxial growth is suppressed with the slightest elastic tension in the copper carrier as well as with lattice defects in the single crystal region of the copper carrier. To obtain a niobium layer of sufficient purity, the crosswise surface dimensions of the grains of the copper carrier at the face thereof upon which the niobium is deposited should be as large as possible. With an average grain crosswise surface dimension of less than 1 mm., the purity of the niobium layer for a later application, especially such as for superconductive resonators, is insufficient in the absence of degasification. The average crosswise grain surface dimension at the face of the copper carrier must be at least 1 mm. To achieve a still larger purity of the deposited niobium layer, it is especially desirable to use copper carriers having an average crosswise surface grain dimension of at least 5 mm.

The cleaning effect is attributed to the fact that the large grain structure of the copper carrier is continued in the deposited niobium layer, the latter having therefore only small grain boundary surfaces on which contaminations can be included. With a comparison of the residual resistance ratio of niobium layers deposited upon copper carriers having small grain crosswise surface dimensions and of niobium layers deposited on copper carriers with large grain crosswise surface dimensions, this cleaning effect becomes very pronounced because the residual resistance ratio increases sharply with decreasing contamination content. The residual resistance ratio is the quotient of the electrical resistance in the normal conducting state at a temperature of 298° K. divided into the resistance at a temperature of 4.2° K. Whereas the residual resistance ratio with fine crystal niobium layers is only about 5, the large crystal niobium layers have residual resistance ratio of about 20. Fine crystal and large crystal niobium layers result from depositions on copper carriers having an average grain crosswise surface dimension of about 0.3 mm. and greater than 5 mm. respectively. The transition temperature of a large crystal niobium layer is about 9.25° K. whereas the transition temperature of a fine crystal niobium layer is about 8° K. In addition to this increase in transition temperature, it is noted that with large crystal layers there is also an increase in the critical magnetic fields $H_{C1}$ and $H_{C3}$. Also, the large crystal niobium layers with not too great a layer thickness have a very narrow surface roughness of a depth of less than 1 $\mu$m. in the region of the crystal grains, whereas, fine crystal niobium layers have a depth of about 5 to 10 $\mu$m., although the depth of roughness of the upper surface of the copper carrier amounts to only about 1 $\mu$m. The great purity and small surface roughness of the large crystal niobium layers are advantageous with the important high frequency surface resistance of the layers, this resistance, important in the application of niobium layers for superconductive resonators, being small compared to that of the fine crystal niobium layers.

Since the copper carriers stipulated for the deposition of niobium layers are in general mechanically worked before the deposition, they usually exhibit, at least on the surface, elastic tension and lattice defects. In addition, the average grain crosswise surface dimension of the usual copper carrier on surface selected to receive deposition is too small. The copper carriers are therefore annealed under vacuum or in the presence of a protective gas such as helium or argon, so that there takes place a relaxation of tension and recovery of the structure as well as a grain growth to an average grain crosswise surface dimension of up to at least 1 or 5 mm.

Preferably, for this treatment, copper carriers with a purity of at least 99.9% by weight are used, since the movement of the grain boundaries required for grain growth is impaired by intense contamination so that to achieve the desired grain crosswise surface dimension, too long an annealing time or too high an annealing temperature is required.

Preferably, annealing takes place under high vacuum with a residual gas pressure of not higher than $10^{-6}$ torr, since the annealing achieves simultaneously a cleaning effect by degasification.

A grain growth occurs at a temperature above the recrystallization temperature of the copper carrier, therefore above the temperature at which the recrystallization commences. For electrolyte copper of a purity of about 99.9% by weight, the recrystallization temperature lies at about 350° C. It is preferable to anneal at temperatures substantially higher than the recrystallization temperature, since with a low annealing temperature, too long a time is needed for technical purposes to obtain the desired grain crosswise surface dimension.

With a copper carrier having a purity of 99.9% by weight, the annealing under high vacuum with a residual gas pressure of as high as $10^{-6}$ torr can occur advantageously between about 800 to 900° C. and to obtain average grain crosswise surface dimensions of at least 1 mm. and 5 mm., about 2 and 8 hours respectively are required. With annealing times of more than 12 to 15 hours, average grain crosswise surface dimensions of up to 10 mm. are obtained. Annealing temperatures of over 900° C. are undesirable, since with such high temperatures, the copper carrier becomes deformed by creeping.

With an annealing temperature of about 500° C., the mentioned annealing times are extended by more than a factor of ten. Annealing time is also extended with annealing under a protective gas.

The copper carrier can be exposed to air after annealing and cooling to room temperature. Oxide layers which arise on the surface of the copper carrier can be removed by electrolytic polishing shortly before the copper carrier is placed in the deposition apparatus.

In using thin copper sheets as a carrier, it is important to note that by annealing, the maximum grain crosswise surface dimensions, which are obtained through grain growth, are about five times the sheet thickness, since the grain growth is impeded by the copper sheet surfaces. When the grain crosswise surface dimensions of 5 mm. and more are to be obtained, a copper sheet being thicker than 1 mm. should be used.

The fused bath electrolytic deposition of the niobium layer on the copper carrier can be performed in accordance with known methods. As electrolyte, smelts or melts of niobium fluoride and alkali fluoride are especially to be considered.

The invention will now be elucidated in greater detail with reference to the accompanying drawing wherein:

FIG. 1 illustrates schematically, in section, an apparatus for annealing a copper carrier in preparation for deposition; and FIG. 2 is a schematic illustration, partially in section, showing an apparatus for coating a copper carrier with niobium by fusion electrolysis.

The following example will more carefully illustrate the application of a niobium layer to a copper cylinder by means of fused bath electrolysis in accordance with the method of the invention. First, the cylinder 1 consisting of electrolytic copper being 99.93% by weight pure (ECu 20060, F26 in accordance with DIN 1773) is annealed in the apparatus of FIG. 1. The apparatus consists essentially of a graphite cylinder 2 having a central bore. The cylinder 2 is surrounded by a water cooled spiral copper tube 3 that functions to heat the cylinder by high frequency induction. The graphite cylinder 2 and the spiral copper tube 3 are disposed in a stainless steel vessel 4 that is closable so as to be vacuum tight. The copper cylinder 1 is first placed in the bore of the graphite cylinder 2. The vessel 4 is then closed and evacuated through pipe socket 5 to a residual pressure of $10^{-6}$ torr. With the help of the spiral copper tube 3, the copper cylinder 1 is then annealed for about 8 hours at a temperature of 850° C. In the course of annealing, the average grain crosswise surface dimension of cylinder 1 increases from about 10 μm. to about 5 mm. At the same time, the cylinder recovers from elastic tension and lattice defects. After completion of the annealing process, the high frequency heating is turned off, and after cooling, the cylinder 1 is removed from the apparatus shown in FIG. 1.

If the cylinder 1 remains exposed to air a long time after annealing, it is electrolytically polished before application of the niobium layer to remove any oxidation layers which may have developed on its surface. The oxide layers can be removed in an electrolyte containing orthophosphoric acid ($H_3PO_4$) and water in a mixture ratio of 1:1. Therewith, the cylinder 1 is connected as the anode. In like manner, copper acts as cathode. The cell voltage is about 4 to 5 volts and the current in the anode is about 50 ma./cm.$^2$.

Thereafter, a niobium layer is applied to the cylinder 1 in the apparatus shown in FIG. 2 by means of fused bath electrolytic deposition. This apparatus consists essentially of a stainless steel tank 11 provided with an ancillary member 12 placed thereon, the latter being likewise of stainless steel. The tank 11 and ancillary member 12 are evacuated and supplied with a protective gas. The tank 11 is surrounded by a resistance oven 13. In the tank 11, there is a nickel tank 14 that serves to receive the molten electrolyte 15. The upper part 16 of ancillary member 12 serves as a lock chamber that makes possible the exchange of the copper carriers to be coated at the working temperature of the electrolyte. Part 16 is then separated from the rest of the apparatus by means of a vacuum-tight slide valve 17. At the upper end of the lock chamber 16, a vacumm-tight passage 18 is provided to accommodate the holding means of the copper carrier and the niobium anode. The passage 18 permits a vertical movement of the holding means. As sealing elements, rings of synthetic material, especially those of polytetrafluorethylene (e.g. Teflon), can be used. Two concentric nickel tubes 21 and 22, electrically insulated from each other, serve as the holding means for supporting the copper cylinder 19 and the cylinder-shaped niobium anode 20. The tubes 21 and 22 can be connected to a source of direct current voltage, not illustrated in FIG. 2. In addition, an agitator 23 is provided which consists of niobium and is turned by means of a rod 24.

As an electrolyte, potassium heptafluoroniobate $$(K_2NbF_7)$$

can be used, which is dissolved in a eutectic mixture of sodium fluoride, potassium fluoride and lithium fluoride. Therewith, the electrolyte comprises 16.2% by weight $K_2NbF_7$; 10.5% by weight NaF; 47.0% by weight KF and 26.2% by weight LiF. After introducing these constituents in the nickel tank 14, the steel tank 11 and ancillary member 12 are first evacuated and then supplied with a protective gas such as argon having a purity of 99.99% by weight, the gas being introduced and removed through pipe sockets 25 to 28 respectively. By means of the oven 13, the electrolyte 15 is brought to a molten state and to a temperature of about 740 to 750° C. The temperature can be controlled with a heat sensitive element provided with a nickel protective jacket which is immersed in the electrolyte 15, the element and jacket not being illustrated. Thereafter, the lock chamber 16 is separated from the rest of the apparatus by means of a slide valve 17. The copper cylinder 19 secured to tube 21 and the niobium anode 20 secured to tube 22 are then brought into the lock chamber 16, which is again evacuated and supplied with argon through pipe sockets 25 and 26 respectively. With the attachment of the copper cylinder 19 to the tube 21, care must be taken that no thermal and elastic tension occurs in the cylinder 19. After opening the slide valve 17, the copper cylinder is inserted into the tank 11 and held above the electrolyte 15 until it has warmed to the temperature of the later; this is required, since with an immediate immersion of the copper cylinder 19 into the electrolyte 15, the electrolyte on the surface of the copper cylinder would cool and the application of a niobium layer to the copper cylinder would be retarded. When the copper cylinder 19 has warmed to the temperature of the electrolyte 15, the cylinder is immersed in the electrolyte together with the niobium anode 20. Thereafter a direct current voltage of at most 0.25 volt is applied across the niobium anode and the copper cylinder 15 that serves as the cathode. The deposition of niobium on the copper cylinder 19 then occurs with a current density of about 40 to 50 ma./cm.$^2$. By means of the agitator 23, which turns for example at 20 revolutions per minute, the electrolyte is moved at a moderate speed relative to the copper cylinder 19. The rate of deposition of the niobium on the copper cylinder is approximately 0.5 to 1 $\mu$m per minute.

After the deposition, for example after the formation of niobium layer having a thickness of approximately 20 to 30 $\mu$m, the copper cylinder 19 is withdrawn from the electrolyte 15 to the lock chamber 16 wherein the cylinder is cooled in argon to room temperature, the chamber 16 being cooled by water flowing through the cooling winding 29. After cooling, the cylinder 19 is removed from the deposition apparatus. The residue of the electrolyte sticking to the cylinder is removed in a water bath at about 20° C. with a hard plastic brush.

The deposited niobium layer has a transition temperature of 9.2 degrees K, a residual resistance ratio of 20 and the critical magnetic fields: $H_{C1}$=0.8 KOe., $H_{C2}$=8.5 KOe. and $H_{C3}$=16.5 KOe. The deposition of niobium layers of greater thickness by fused bath electrolysis is difficult because with the continued growth of the crystals, the projections on the surface of the deposited niobium layer grow at an ever increasing rate because of the field concentration in the electrolyte and with a coating applied over a long period of time, an incoherent layer results consisting of long columnar and/or needle-like niobium crystals. The aforementioned projections develop because of the unavoidable surface roughness of the copper carrier. With the large grain crosswise surface dimensions obtained according to the method of the invention, there is achieved the phenomenon that growing niobium crystals first become cubic with longer growth. Therefore, there is obtained a thicknes of the niobium layer of the same magnitude with smooth surface and with grain crosswise surface dimensions of several millimeters, before columnar crystals are formed. In the event that too great a surface roughness occurs with thick niobium layers, the roughness can be removed by means of electrolytic polishing. For this purpose, for example, an electrolyte of 85% sulfuric acid and 15% hydrofluoric acid is suitable, to polish the niobium layer used as the anode with niobium also being used as the cathode. The voltage between anode and cathode can be, for example, 5 to 9 volts and the current density amounts to 20 ma. per cm.$^2$. Under these conditions, about 1$\mu$m. of niobium is removed per minute. Should the niobium layer thickness achieved in this manner be inadequate, the copper carrier having the niobium layer can, after polishing, again be placed in the illustrated apparatus and coated anew with niobium. Niobium layers of greater thickness produced in this manner can also be separated from the copper carrier and degased in an ultrahigh vacuum of about 5.10$^{-9}$ torr for about one hour at temperatures of about 2050° C. The method according to the invention affords the additional advantage that with large crystal niobium layers deposited by this method, for the purpose of the same residual resistance ratios essentially smaller annealing times are required than are required with fine crystal layers. The danger that niobium structures become deformed with annealing is thereby substantially removed.

In addition to forming niobium layers for superconducting resonators, the method according to the invention is suitable for producing other superconducting components. For example, in the manufacture of gate conductors for high current cryotrons, there is the advantageous application where smooth niobium layers are likewise desired.

To those skilled in the art it will be obvious upon a study of this disclosure, that the invention permits of various modifications and hence may be given embodiments other than illustrated and described herein, without departing from the essential features of the invention and within the scope of the claims annexed hereto.

I claim:

1. Method of producing a niobium layer of large crystalline structure comprising the step of electrolytically depositing niobium from a fused bath onto the surface of the copper carrier, said carrier being free of tension and substantially free of lattice defects, said surface having an average grain crosswise surface dimension of at least 1 mm., whereby said niobium layer grows epitactically on said surface of said carrier.

2. The method of claim 1, wherin the surface of said copper carrier has an average grain crosswise surface dimension of at least 5 mm.

3. The method of claim 1, wherein the method includes the step of annealing the copper carrier in a vacuum prior to depositing the niobium, so that the structure of the copper is freed from stress and the grains in the surface of the carrier grow so as to have an average grain crosswise surface dimension of at least 1 mm.

4. The method of claim 3, wherein the copper carrier has a purity of 99.9% by weight.

5. The method of claim 4, wherein the vacuum includes a residual gas pressure of not greater than 10$^{-6}$ torr.

6. The method of claim 5, wherein the copper carrier is annealed for about two hours at a temperature in the approximate range of from 800° C. to 900° C.

7. The method of claim 3, wherein the grains in the surface of the carrier grow so as to have an average grain crosswise surface dimension of at least 5 mm.

8. The method of claim 7, wherein the copper carrier has a purity of 99.9% by weight.

9. The method of claim 8, wherein the copper carrier is annealed for about 8 hours at a temperature in the approximate range of from 800 to 900° C.

10. The method of claim 1, wherein the copper carrier is annealed in a protective gas prior to depositing the niobium, so that the structure of the copper is freed from stress and the grains in the surface of the carrier flow so as to have an average grain crosswise surface dimension of at least 1 mm.

11. The method of claim 10, wherein the copper carrier has a purity of 99.9% by weight.

12. The method of claim 11, wherein the copper carrier is annealed for about two hours at a temperature in the approximate range of from 800° C. to 900° C.

13. The method of claim 10, wherein the grains in the surface of the carrier grow so as to have an average grain crosswise surface dimension of at least 5 mm.

14. The method of claim 13, wherein the copper carrier has a purity of 99.9% by weight.

15. The method of claim 14, wherein the copper carrier is annealed for about eight hours at a temperature in the approximate range of from 800° C. to 900° C.

References Cited

UNITED STATES PATENTS

| | | | |
|---|---|---|---|
| 3,444,058 | 5/1969 | Mellors et al. | 204—39 |
| 3,024,175 | 3/1962 | Cook | 204—39 |

HOWARD S. WILLIAMS, Primary Examiner

R. L. ANDREWS, Assistant Examiner